United States Patent
Gaglani

[19]

[11] Patent Number: 5,900,739
[45] Date of Patent: May 4, 1999

[54] METHOD AND APPARATUS FOR ENTERING A TEST MODE OF AN EXTERNALLY NON-PROGRAMMABLE DEVICE

[75] Inventor: Pranay Gaglani, Austin, Tex.

[73] Assignee: Advanced Micro Devices Inc., Sunnyvale, Calif.

[21] Appl. No.: 08/710,937

[22] Filed: Sep. 24, 1996

[51] Int. Cl.[6] .................................................. G01R 31/28
[52] U.S. Cl. ........................................... 324/765; 324/763
[58] Field of Search ................................ 324/73.1, 158.1, 324/765, 763; 371/22.1, 22.3, 22.6, 22.5; 257/40, 48; 438/17, 14

[56] References Cited

U.S. PATENT DOCUMENTS

| | | |
|---|---|---|
| 4,398,146 | 8/1983 | Draheim et al. ........................ 324/765 |
| 5,111,136 | 5/1992 | Kawashima ............................. 324/73.1 |
| 5,161,159 | 11/1992 | McClure et al. ...................... 324/158.1 |
| 5,432,440 | 7/1995 | Bartlett .................................. 324/73.1 |

*Primary Examiner*—Vinh P. Nguyen
*Attorney, Agent, or Firm*—Foley & Lardner

[57] ABSTRACT

A method and apparatus of triggering a device, such a pin limited integrated circuit, to enter a test mode includes embedding a circuit into the device to detect the presence of signal conditions not encountered in normal operation. Predefined ones of such signal conditions when detected cause the device to activate one or more test modes by generating one or more internal test signals.

18 Claims, 4 Drawing Sheets

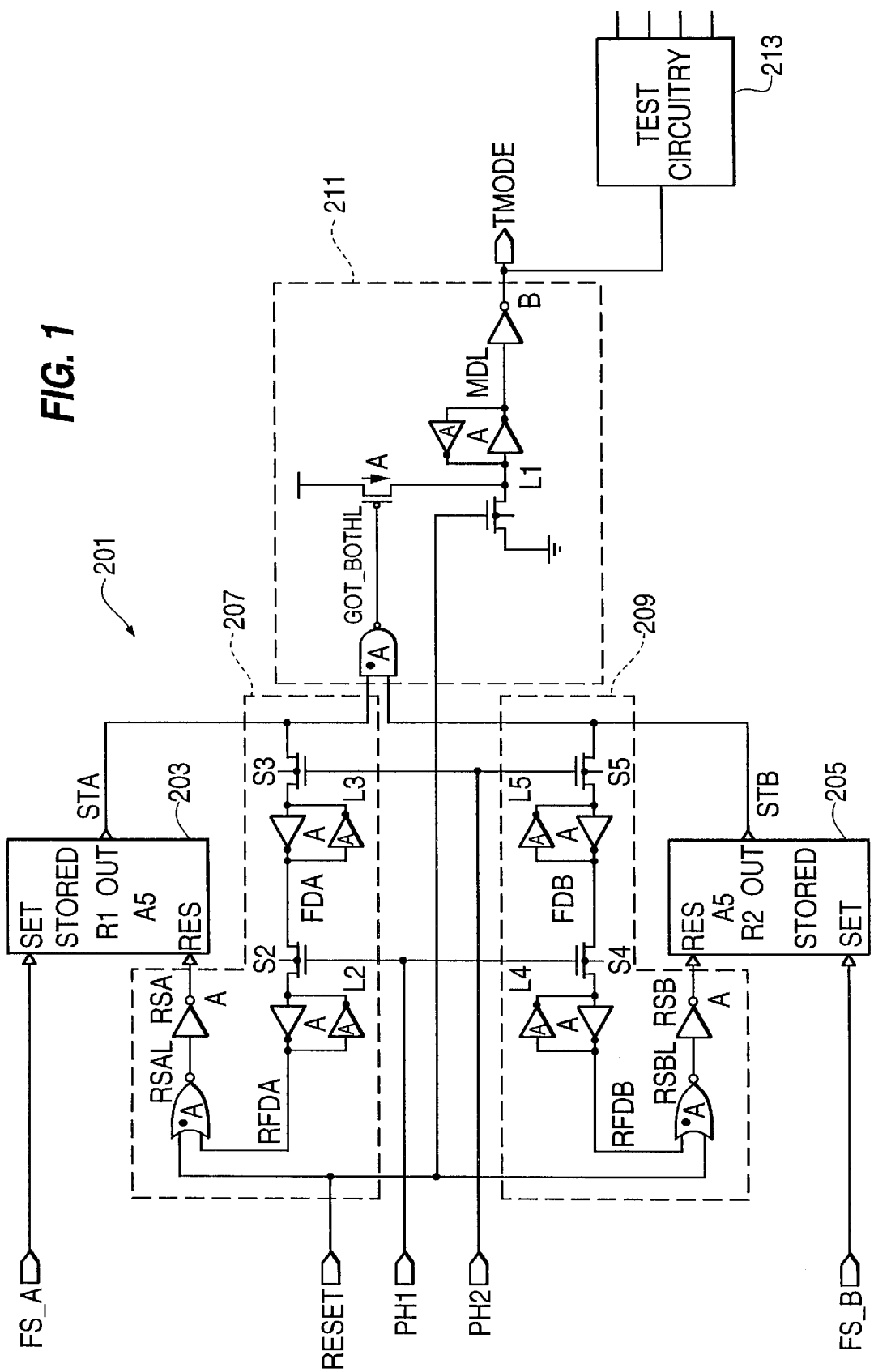

METHOD AND APPARATUS FOR ENTERING A TEST MODE OF AN EXTERNALLY NON-PROGRAMMABLE DEVICE

FIELD OF THE INVENTION

The invention relates to a method and apparatus for testing a circuit device. In particular, the invention relates to placing an externally non-programmable device with pin constraints into a test mode.

RELATED ART

A conventional VLSI circuit design process includes architecture definition, circuit implementation and device verification. Whatever the device functionality, it is always desired, and most times required, to verify device operation before shipping it for end use. In the design implementation phase, testability is often considered a required embedded functionality. Thus, providing access for test engineering to probe the device and uncover any malfunctioning blocks is an important design goal. Moreover, testability is part of the design process to provide information needed for device verification and debugging. Testing during design reveals device faults and design insufficiencies, so that the device can be declared operational and reliable. Thus, testing addresses two basic requirements: debugging and production reliability.

In the initial phase of the design process, testing helps identify functional and hardware blocks which may not perform to the specification due either to design architecture errors or to implementation inaccuracies. This is the debugging phase. As the number of functions and hardware elements embedded in the same device increases, it becomes more difficult to pinpoint blocks and sub-blocks not performing to the required specification. Therefore, one objective of testing is providing individual access to the various functionalities and hardware elements of the device, so that the performance characteristics thereof can be evaluated.

When all such functional inaccuracies (if any) are resolved, the next goal of testing is to verify the physical integrity and reliability of units before end use. In the production testing phase, devices undergo a series of tests to be declared physically operational and reliable.

As evident from the above explanation, testing is an integral part of the design process and it must be accommodated with primary device functionalities to insure proper device operation. In order to achieve these testing goals, a device under test is often programmed to enter one or more test modes in which the operation of one or more of the device's sections is evaluated. Once the device is in a particular test mode, a predefined sub-section is exercised and all the important signals corresponding to this sub-section of the device are brought out to the external pins for observation. A test mode thus allows one to debug and verify a sub-block or one of the functionalities of the device. Normally a device may enter several test modes. Different functionalities are individually addressed in each of these test modes. Depending upon a particular test mode selected, the functionality of the device may change. The pin-mapping of the device may also change, causing the functional behavior and desired performance characteristics of various pins to change.

Accommodating all such test requirements without changing the normal operation of the device requires programming the device in a test mode. Entering the test mode requires communication with the device. If the device is an externally programmable part, test engineering can program the device to enter the test mode and conduct the required testing. Commands to execute testing can be provided through pins available for external programming. The end user, however, is often not provided this information so as not to enter the test mode.

When the part is not externally programmable, there is no pre-defined communication channel through which test engineering can communicate with the device. The functional description and the behavior of each pin is pre-characterized and cannot be altered to insert the test mode. In such a case, another option is to visit each pin on the device and use a pin strapping technique on an available pin to control the operational mode of the device. In pin strapping, an external input pin, not used otherwise, is either tied to VCC or GND. Depending upon which voltage supply the pin is tied to, the device can be guided to operate in either a test mode or a normal operating mode. However, this method requires that a pin be available for strapping. Hence, the device is either programmable or has some external pin available for the test mode entry. However, using these techniques there is no way to enter a test mode if an external pin is not available.

SUMMARY AND OBJECTS OF THE INVENTION

In view of the above and other limitations of the related art, the invention provides a method and apparatus for allowing a device which is not externally programmable to enter a test mode, even when such a device which is pin limited. The invention provides a device which enters a test mode based on conditions present on pins providing signals for other non-test functions. The invention further provides a device which enters a test mode upon detection of an illegal condition on one or more pins of the device.

The invention provides a method and apparatus to trigger a circuit or other device to enter a test mode. The circuit generates signals in a predetermined relationship. For example, under proper operating conditions, selected signals do not exist at the same time or may not be within the same range of selected parameters (e.g. voltage or phase) simultaneously. A condition inconsistent with the predetermined relationship is detected. Upon detection of such a condition, a test mode is initiated.

BRIEF DESCRIPTION OF THE DRAWINGS

The above and other objects are met by a method and apparatus according to the invention as described herein with reference to the drawings in which:

FIG. 1 shows a circuit that can be embedded in a device to detect an anomaly and trigger entry into a test mode.

DESCRIPTION OF THE PREFERRED EMBODIMENTS

Figure 2A:
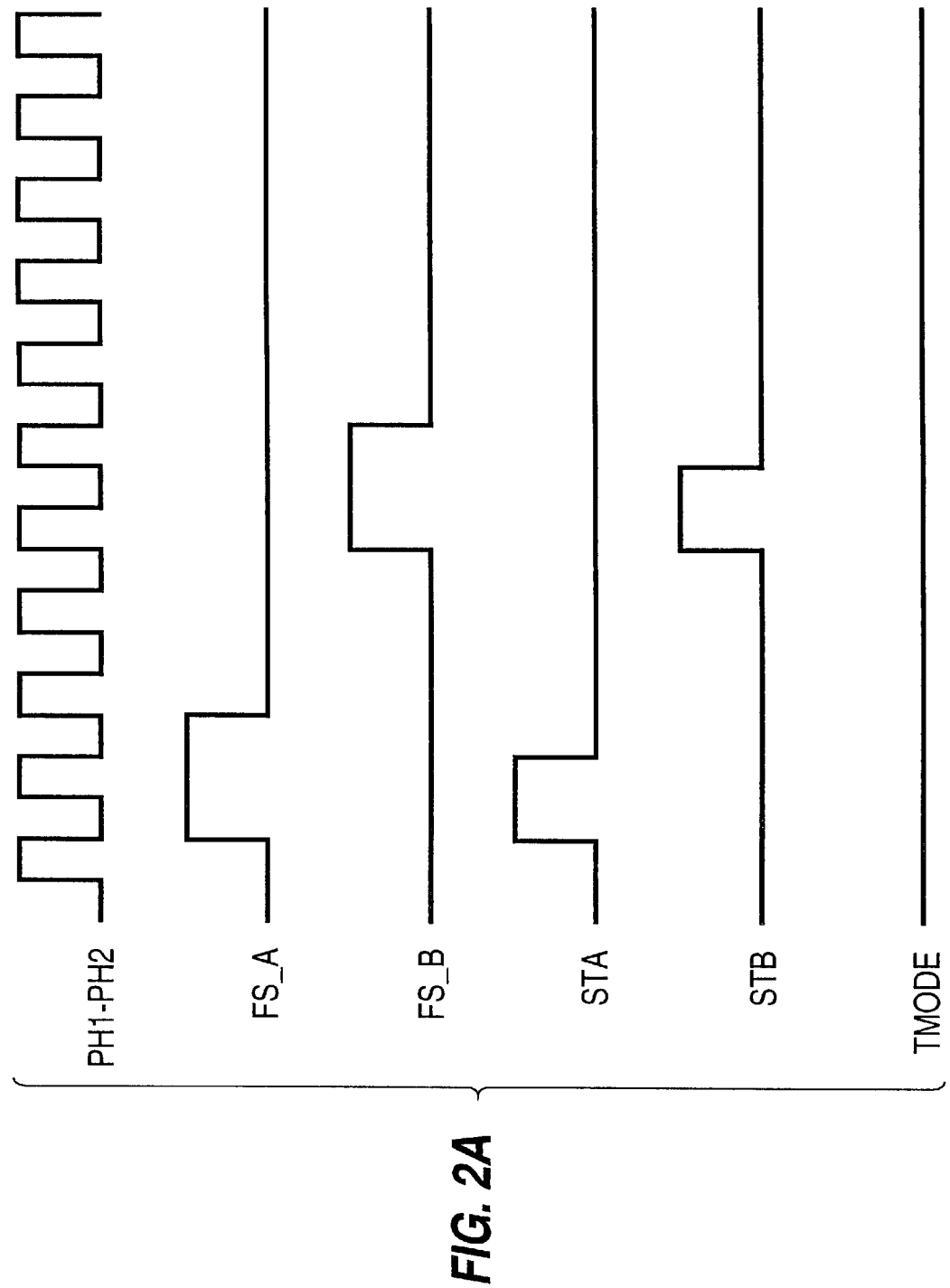
FIGS. 2A and 2B show timing diagrams of the operation of the circuit in both normal and test mode.

The method and apparatus according to the invention applies to the situation when the device is not externally programmable. Therefore, the device cannot be programmed to be in a test mode. One such circumstance occurs when all the pins of the device have pre-defined characteristics. In this case, none of the pins is available for pin strapping to guide the device into a test mode. According to the invention, the functional characteristics of various pins are observed. The activities of each pin are mapped in time. Activities, illegal under normal operations, are identified and are used to guide the device into a test mode.

One example of such a device is Quad-SLAC NP (non-programmable Quad-Subscriber Line Application Controller) available from Advanced Micro Devices, Inc. Since the device is non-programmable, there is no conventional way of communicating with the device to be programmed to operate in a test mode. The pin description of the device is shown in Table 1. As seen from the pin description, all the 32 pins have pre-defined different characteristics and there is no spare pin that can be used for pin strapping.

TABLE 1

Pin Description of QSLAC-NP

| Symbol | Function |
| --- | --- |
| BCKLK$_R$/A$\mu$SEL | Receive Bit Clock or A-law, $\mu$-law Select: The bit clock which shifts data into D$_R$ after the appropriate FS$_R$i leading edge. Its frequency may vary from 64 kHz to 4.096 MHz. Alternatively, it may be a logic input which selects either A-law or $\mu$-law in synchronous mode with BCLK$_x$ used as the bit clock in both the transmit and receive directions. |
| BCLK$_x$ | Transmit Bit Clock: The bit clock which shifts out the PCM data on D$_x$. Its frequency may vary from 64 kHz to 4.096 MHz, but it must be synchronous with MCLK. |
| D$_R$ | Receive Data Input: PCM data is shifted into D$_R$ following the FS$_R$i leading edge. |
| D$_x$ | Transmit Data Output. The tri-state PCM data output which is enabled by any of the FS$_x$i inputs. |
| FS$_R$1, FS$_R$2, FS$_R$3, FS$_R$4 | Receive Frame Sync: The pulse which enables BCLK$_R$ to shift PCM data on D$_R$. FS$_R$c is an 8 kHz pulse train. The letter "c" designates the channel number (c = 1, 2, 3, or 4). |
| FS$_x$1, FS$_x$2, FS$_x$3, FS$_x$4 | Transmit Frame Sync: The pulse which enables BCLKx to shift out the PCM data on D$_x$. FC$_x$c is an 8 kHz pulse train. The letter "c" designates the channel number (c = 1, 2, 3 or 4). |
| GAIN | Transmit Gain Control: The gain of every transmit input is proportional to the value of the resistor (R$_{GAIN}$) which is connected from GAIN to AGND. |
| IF$_x$11, IF$_x$12, IF$_x$13, IF$_x$14 | Transmit Current Mode Input: A resistor (R$_{IN}$c) must be connected from the transmit voltage signal for channel c to the IF$_x$Tc pin, which sits at the same voltage as the V$_{REF}$ pin. The transmit gain of channel c is equal to R$_{GAIN}$/R$_{IN}$c. |
| PDN1, PDN2, PDN3, PDN4 | Power Down Control: A logic high on PDNc will power down channel c. |
| MCLK | Master Clock: The master DSP clock. The allowed clock frequencies are 1.536 MHz, 1.544 MHz, and 2.048 MHz. |
| TS$_x$ | Transmit Time Slot: Open drain output which pulses low during the encoder time slot. |
| VF$_R$01, VF$_R$02, VF$_R$03, VF$_R$04 | Receive Output Voltage: VF$_R$Oc is the analog output voltage from the receive power amplifier for channel c. |
| V$_{REF}$ | Reference Voltage: Reference voltage for the analog input and output amplifiers. |
| AGND | Analog Ground |
| DGND | Digital Ground |
| V$_{CCA}$ | Analog Vcc: +5 V power for analog circuitry |
| V$_{CCD}$ | Digital Vcc: +5 V power for digital circuitry. |

As used herein, a framesync is a signal that synchronizes the data transmission and reception over the same bus. Devices such as Quad-SLAC send and receive digital voice data over a bus. This bus is shared by more than one such Quad-SLAC or like devices. Based upon the pre-specified time, each channel within a Quad-SLAC gains the control of the bus and transmits data during its time-slot.

These time-slots are referenced to framesync signals. The descriptive list of pins in Table 1 shows that there are a total of eight framesyncs. Four of them are receive framesyncs for four channels, FS$_R$1 . . . FS$_R$4, FS$_x$1 . . . FS$_x$4. Of course, the invention can be generalized to accommodate any number of such framesync signals.

The framesync initiates the time-slots and has a frequency of, for example, 8 Khz. Based upon the clock at which the digital voice data is transmitted, one 8 Khz cycle of framesync will accommodate a plurality of time-slots. Each channel is then assigned a time-slot during which it transmits or receives data.

The functional characteristics of these framesyncs are as follows. The receive framesync for two different channels (e.g., FS$_R^1$ and FS$_R^3$), may be the same if more than one channel wants to receive the same information. A transmit framesync may be the same as a receive framesync, e.g., FS$_x^1$ and FS$_R^4$, since the data transmitted by one channel is received by some other channel. However, no two transmit framesyncs, e.g., FS$_x^1$ and FS$_x^4$, can occur at the same time, because one and only one channel may drive the bus at a given time.

Given the functional qualification described above, in normal operation of a QuadSLAC, none of the Transmit FrameSyncs, FS$_x^1$ . . . FS$_x^4$, will occur at the same time. Since it would be functionally illegal for any two Transmit FrameSyncs to occur at the same time, this functional constraint can be used as a condition to put the device into the test mode. According to the invention, the occurrence of two pre-specified Transmit FrameSyncs at the same time is an illegal operation and is decoded as a request to the device to enter the test mode.

FIG. 1 shows a circuit 201 that can be embedded into a device and can be used to implement the method described above. In FIG. 1, signals FS_A and FS_B are two transmit framesyncs. Signals PH1 and PH2 are two phases of a high speed internal clock having a frequency higher than the frequency of the clock receiving and transmitting the digital voice data processed by the Quad SLAC. The RESET signal initializes the device. The signal TMODE indicates the operating mode of the device. When TMODE is in a first logical state, e.g., a logical low, the device is in a normal operating mode. When TMODE is in the opposition logical state, e.g., a logical high, the device is to be placed in a test mode.

The circuit 201 includes the two "rising edge detectors" 203, 205, two feedback latches 207, 209 and some control logic 211 to detect the request to enter the test mode. Each feedback latch includes two latching circuits, L2–L5, each formed, for example, from a pair of inverters and two switches, such as switching transistors S2, S3, S4, S5. Switching transistors S2 and S4 are activated by a first phase clock PH1, and switching transistors S3 and S5 are activated by a second phase clock PH2.

On the power up of the device, the RESET signal initializes the device to ensure that the signal TMODE is low, initiating normal operation on power up. The RESET signal also initializes the two rising edge detector blocks 203, 205. Each rising edge detector circuit has two inputs and one output. The inputs are the set node, SET, and reset node, RES. The output node is OUT. A logical high level at the input RES clears the output OUT to zero, irrespective of the signal value at the input SET. With a logical low level at the input RES, a rising edge at the input SET will set the output OUT to one. Signals PH1 and PH2 control the feedback latches. The output of each of the rising edge detector circuits 203, 205 is fed back to the reset input RES of the corresponding rising edge detector circuit through the respective feedback latches 207, 209 operated by PH1 and PH2.

Figure 2B:
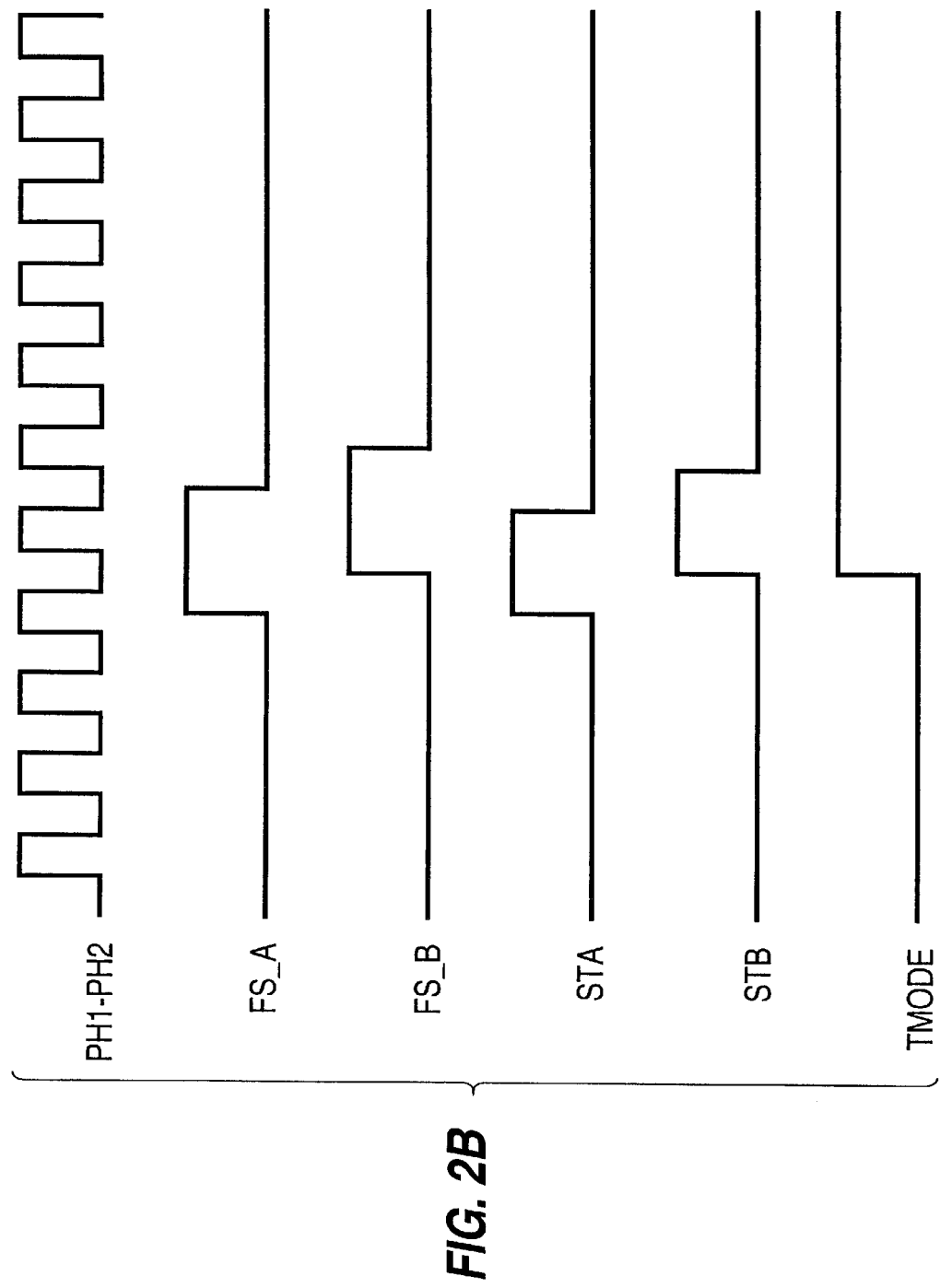
Figure 3:
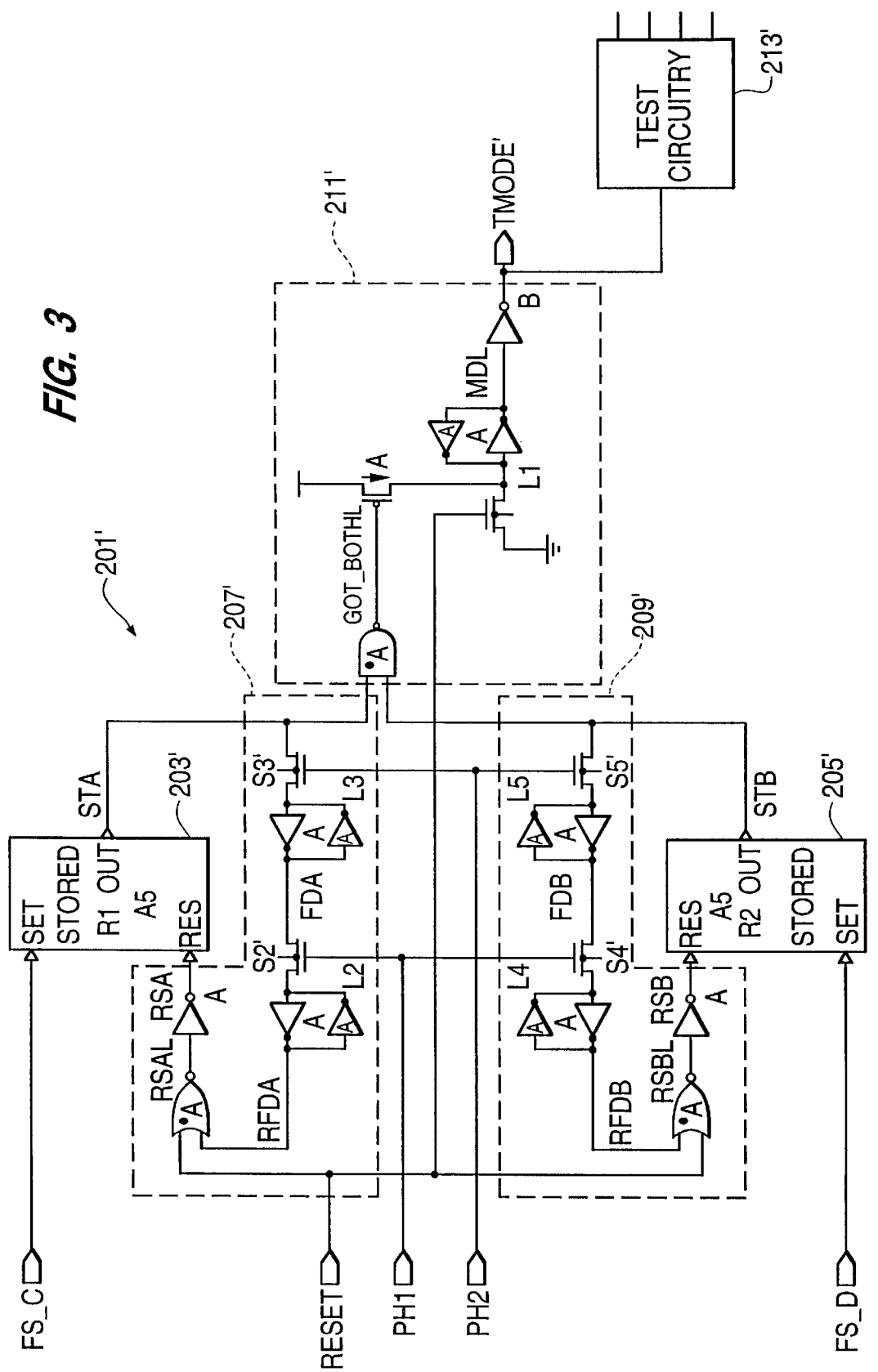
FIG. 3 shows another circuit that can be embedded in a device to detect an anomaly and trigger entry into a test mode for a different portion of the device.

FIGS. 2A and 2B further describe the circuit 201 through timing diagrams of its normal and testmode operations. Under normal operation, as shown in FIG. 3A, the signals FS_A and FS_B do not rise within one PH1–PH2 clock cycle of each other. When FS_A rises, the rising edge detector circuit 203 will set the node STA high. This STA node will remain high until the corresponding rising edge detector circuit 203 receives a high level at its reset node. This is accomplished through the feedback latches operated by the PH1 and PH2 signals. When STA goes high, it pulls node FDA low in the following PH1 phase. This, in turn, sets the node RFDA high in the following PH2 phase. Thus, node RSA is set high, generating a reset to the rising edge detector circuit 203. With the node RSA going high, node STA is reset to low. Again this value of STA is fed back to node RSA one PH1–PH2 clock cycle later. With the node RSA low, the entire cycle repeats at yet another rising edge of the signal FS_A. In other words, every rising edge at the input SET of the rising edge detector circuit generates a pulse at the output OUT.

The same circuit is replicated for the signal FS_B. And therefore the node STB gets set at the rising edge of the signal FS_B and gets reset one PH1–PH2 cycle later. Thus, node STB experiences a pulse at the rising edge of the signal FS_B.

The timing of the nodes STA and STB determine the state of the operation of the device. These two nodes are pulses generated by respective framesyncs. These two node values are used to generate signal GOT_BOTHL. The signal GOT_BOTHL is normally high and therefore does not force any activity. Only when this GOT-BOTH node goes low, is the node TMODE set high. The only time the node GOT_BOTHL goes low is when the signals STA and STB are high at the same time. That is, if the pulses generated by the rising edge detectors 203, 205 coincide, then and only then will the signal GOT_BOTHL go low, which will set the signal TMODE high. With TMODE in this condition, the device is declared to be in the test mode as is shown by the the testmode operation timing diagram in FIG. 2B. The signal TMODE cannot be brought out to a pin, since the device is already pin limited. However, the TMODE signal is used within the device to control the circuit to enter the test mode, for example, using test circuitry 213. In the test mode, the device generates one or more signals on pins that can be observed to evaluate the integrity of the device. The device is recovered back to the normal operating state by issuing a RESET signal.

Thus, according to the invention, even when a device is non-programmable and that no spare pins are available, as is the case with QuadSLAC in this example, the device is placed in a test mode. The test mode is activated by observing the functional specification of various pins and detecting an illegal condition during the normal operation of the device, as a condition for entering the test mode.

The above is provided by way of example and not limitation, since the method and apparatus according to the invention can be applied to other devices and signal relationships. While the example above uses the presence of multiple signals, e.g., two transmit signals, simultaneously as the anomalous condition to trigger test mode operation, other signal relationships can also be used to trigger test mode entry. The method and apparatus according to the invention can be generalized to include the detection of any number of signal conditions to trigger operation in the test mode. Further, according to the invention, different combinations of signal conditions can be detected to trigger different test modes involving different sequences of test steps. For example, the presence of one pair of signals simultaneously may be used to initiate a first test sequence for testing a first portion of the device, while a second pair of signals present simultaneously may be used to initiate a second test sequence for testing a second portion of the device. Of course, any number of such conditions may be permitted. For example, referring now to FIG. 3, circuit 201', which is also embedded in the same device as circuit 201 of FIG. 1, receives transmit framesync signals FS_C and FS_C instead of FS_A and FS_B of circuit 201 of FIG. 1. By having both circuit 201 and circuit 201' in a device, the output TMODE of circuit 201 (see FIG. 1) may be used to test a first portion (not shown) of the apparatus which houses circuit 201 and circuit 201', and the output TMODE' of circuit 201' may be used to test a second portion (not shown) of the apparatus which houses circuit 201 and circuit 201'.

What is claimed is:

1. An apparatus for triggering a device to enter a test mode comprising:
   a plurality of input ports for receiving signals having a predetermined relationship with respect to each other in a normal operating mode of said device;
   means for detecting a condition inconsistent with said predetermined relationship; and
   means for triggering initiation of a test mode upon detection of said condition,
   wherein said means for detecting a condition inconsistent with said predetermined relationship comprises a circuit detecting a simultaneous presence of more than one signal on different ones of said plurality of input ports of said device in a predetermined time frame, and
   wherein said circuit detecting a simultaneous presence comprises a first edge detection circuit and a second edge detection circuit.

2. The apparatus recited in claim 1, wherein said condition comprises the presence of more than one signal in a predetermined time frame.

3. The apparatus recited in claim 1, wherein said means for detecting a condition detects a plurality of conditions with a particular one of said conditions initiating the test mode.

4. The apparatus recited in claim 3, wherein the test mode is used to test a first portion of the device, and
   wherein said means for detecting a condition detects another particular one of said conditions which initiates the test mode to test a second portion of said device.

5. The apparatus recited in claim 3, wherein said means for detecting a condition inconsistent with said predetermined relationship comprises a circuit detecting a first signal condition in external pins of said device to initiate the test mode for the first portion of said device and a second signal condition on said external pins of said device to initiate the test mode for the second portion of said device,
   said external pins of said device being configured to connect to other devices via signal line connections.

6. The apparatus recited in claim 1 wherein said means for detecting a condition inconsistent with said predetermined relationship comprises a circuit detecting a simultaneous presence of more than one signal on different external pins of said device in a predetermined time frame.

7. The apparatus recited in claim 1, wherein said first edge detection circuit and said second edge detection circuit have outputs in opposite logical states during predetermined phases of a clock to indicate said normal operating mode, and are a same logical state during said predetermined phases to indicate said test mode.

8. The apparatus recited in claim 7, wherein said means for triggering initiation of said test mode comprises a circuit responsive to said same logical state to trigger a test mode signal.

9. The apparatus recited in claim 8, wherein said first edge detection circuit, said second edge detection circuit, and said circuit responsive to said same logical state to trigger a test mode signal are embedded in said device.

10. The apparatus recited in claim 9, wherein said test mode signal activates test circuitry embedded in said device.

11. The apparatus recited in claim 8, wherein said test mode signal activates test circuitry embedded in said device.

12. The apparatus recited in claim 1, wherein said means for detecting and means for triggering are embedded in said device.

13. The apparatus recited in claim 1, wherein a respective voltage magnitude of the signals during the condition inconsistent with said predetermined relationship is at a same voltage magnitude as during the predetermined relationship in a normal operating mode, and wherein the condition inconsistent with said predetermined relationship is detected by the signals being at substantially the same voltage magnitude at the same time.

14. A method of triggering a device to enter a test mode, the method comprising the steps of:

applying signals in external pins of a device in a predetermined relationship inconsistent with a normal operating mode of said device, detecting said predetermined relationship inconsistent with said normal operating mode, the detecting step being performed by detecting a simultaneous presence of more than one signal on different ones of the external pins of said device in one time frame, the detecting step also being performed by detecting an edge of the more than one signal by a plurality of edge detection circuits, respectively; and triggering initiation of a test mode upon detection of said predetermined relationship.

15. The method recited in claim 14, wherein said detecting step comprises detecting one of a plurality of predetermined relationships inconsistent with said normal operating mode and triggering initiation of the test mode when the detecting of the one of the plurality of predetermined relationships is made.

16. The method recited in claim 14, wherein the plurality of edge detection circuits comprise a first and a second edge detection circuit, and wherein said first edge detection circuit and said second edge detection circuit have outputs in opposite logical states during predetermined phases of a clock to indicate a normal operating mode of said device, and are a same logical state during said predetermined phases to indicate said test mode.

17. The method recited in claim 15, wherein said step of triggering initiation of a test mode comprises a circuit responsive to said same logical state to trigger a test mode signal.

18. The method recited in claim 17, wherein said first edge detection circuit, said second edge detection circuit, and said circuit responsive to said same logical state to trigger a test mode signal are embedded in said device.

\* \* \* \* \*